(12) United States Patent
Avci et al.

(10) Patent No.: US 9,741,832 B2
(45) Date of Patent: Aug. 22, 2017

(54) TUNNELING FIELD EFFECT TRANSISTORS WITH A VARIABLE BANDGAP CHANNEL

(71) Applicant: INTEL CORPORATION, Santa Clara, CA (US)

(72) Inventors: Uygar Avci, Portland, OR (US); Dmitri Nikonov, Beaverton, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/122,402

(22) PCT Filed: Mar. 28, 2014

(86) PCT No.: PCT/US2014/032117
§ 371 (c)(1),
(2) Date: Aug. 29, 2016

(87) PCT Pub. No.: WO2015/147849
PCT Pub. Date: Oct. 1, 2015

(65) Prior Publication Data
US 2017/0069738 A1  Mar. 9, 2017

(51) Int. Cl.
*H01L 29/66* (2006.01)
*H01L 29/739* (2006.01)
*H01L 29/10* (2006.01)
*H01L 29/08* (2006.01)
*H01L 29/24* (2006.01)
(Continued)

(52) U.S. Cl.
CPC .... *H01L 29/66977* (2013.01); *H01L 29/0847* (2013.01); *H01L 29/1025* (2013.01);
(Continued)

(58) Field of Classification Search
CPC ......... H01L 29/66; H01L 29/24; H01L 29/10; H01L 29/423; H01L 29/786; H01L 49/00; H01L 29/08
(Continued)

(56) References Cited

U.S. PATENT DOCUMENTS 6,365,913 B1 * 4/2002 Misewich ............ H01L 49/003
257/289
2003/0054615 A1 * 3/2003 Kim ...................... H01L 49/003
438/310
(Continued)

FOREIGN PATENT DOCUMENTS

KR   10-2013-0099705 A   9/2013

OTHER PUBLICATIONS

International Preliminary Report on Patentability and Written Opinion issued in PCT Application No. PCT/US2014/032117, dated Oct. 13, 2016, 8 pages.
(Continued)

*Primary Examiner* — Asok K Sarkar
*Assistant Examiner* — Dmitriy Yemelyanov
(74) *Attorney, Agent, or Firm* — Grossman, Tucker, Perreault & Pfleger, PLLC

(57) ABSTRACT

Tunneling field effect transistors (TFETs) including a variable bandgap channel are described. In some embodiments, one or more bandgap characteristics of the variable bandgap channel may be dynamically altered by at least one of the application or withdrawal of a force, such as a voltage or electric field. In some embodiments the variable bandgap channel may be configured to modulate from an ON to an OFF state and vice versa in response to the application and/or withdrawal of a force. The variable bandgap channel may exhibit a bandgap that is smaller in the ON state than in the OFF state. As a result, the TFETs may exhibit one or more of relatively high on current, relatively low off current, and sub-threshold swing below 60 mV/decade.

19 Claims, 9 Drawing Sheets

(51) Int. Cl.
*H01L 29/786* (2006.01)
*H01L 49/00* (2006.01)
*H01L 29/423* (2006.01)

(52) U.S. Cl.
CPC .......... *H01L 29/1054* (2013.01); *H01L 29/24* (2013.01); *H01L 29/42392* (2013.01); *H01L 29/66356* (2013.01); *H01L 29/66969* (2013.01); *H01L 29/7391* (2013.01); *H01L 29/78648* (2013.01); *H01L 49/003* (2013.01); *H01L 29/42384* (2013.01)

(58) Field of Classification Search
USPC .......................................................... 257/43
See application file for complete search history.

(56) References Cited

U.S. PATENT DOCUMENTS

| | | | | |
|---|---|---|---|---|
| 2003/0098488 | A1* | 5/2003 | O'Keeffe | B82Y 10/00 257/401 |
| 2010/0140589 | A1 | 6/2010 | Ionescu | |
| 2010/0264482 | A1 | 10/2010 | Bhattacharyya et al. | |
| 2012/0045879 | A1 | 2/2012 | Verhulst et al. | |
| 2013/0137236 | A1 | 5/2013 | Bhuwalka et al. | |
| 2013/0221343 | A1 | 8/2013 | Son et al. | |
| 2014/0097403 | A1* | 4/2014 | Heo | H01L 29/7391 257/27 |

OTHER PUBLICATIONS

Horvat, Alen: "Metal-Mott insulator transitions", University of Ljubljana, Sep. 10, 2013, pp. 1-14.
Liu, Kai, et al.: "Dense Electron System from Gate-Controlled Surface Metal-Insulator Transition", NANO Letters, ACS Publications, 2012 American Chemical Society, Published Nov. 19, 2012, 11 pages.
Strukov, Dmitri B., et al.: "The missing memristor found", Letters, 2008 Nature Publishing Group, vol. 453, May 1, 2008, pp. 80-83.
International Search Report and Written Opinion issued in PCT Application No. PCT/US2014/032117, dated Dec. 23, 2014, 11 pages.

* cited by examiner

TUNNELING FIELD EFFECT TRANSISTORS WITH A VARIABLE BANDGAP CHANNEL

FIELD

The present disclosure generally relates to tunneling field effect transistors (TFETs), and more particularly to TFETs having a variable band gap channel. Methods of forming such TFETs are also described.

BACKGROUND

Metal oxide semiconductors (MOS) are commonly used in integrated circuits, e.g., in metal oxide semiconductor field effect transistors ("MOSFETs"). In general, MOSFETs and other MOS transistors include a source and drain separated by a channel. Flow of current through the channel is generally controlled by one or more gates. With this in mind, a MOSFET or other MOS transistor may be configured to operate in one of three regions depending on its gate-source voltage $V_{gs}$ and drain-source voltage, $V_{ds}$, namely the linear, saturation, and sub-threshold regions. The sub-threshold region is a region wherein the gate-source voltage $V_{gs}$ is smaller than the threshold voltage $V_t$ of the device. $V_t$ is a voltage value (applied to the gate referenced from a source) at which the channel of the device begins to electrically connect the source and drain, i.e., at which transistor current is turned "ON."

The sub-threshold swing (SS) of a transistor is an important characteristic which may be considered relevant to a variety of transistor properties. For example, sub-threshold swing may represent the relative ease with which a transistor may be turned "ON" and "OFF," as well as the rate at which such switching may occur. Sub-threshold swing may be expressed by as a function of kT/q, wherein T is the absolute temperature, k is the Boltzmann constant and q is the magnitude of the electric charge.

The sub-threshold swing of many MOS devices such as MOSFETs has a lower limit of about 60 mV/decade at 300 degrees Kelvin. MOSFETs subject to that limit may be unable to switch ON and OFF faster than 60 mV/decade at room temperature. This limit may also impact operating voltage and threshold voltage requirements of a MOS device such as a MOSFET, particularly when the MOSFET is operated at a low gate-source voltage $V_{gs}$. At such voltages, the ON current of the MOSFET may be quite low, as it may be operating close to its threshold voltage $V_t$. Put in other terms, the 60 mV/decade limit of sub-threshold swing may limit or prevent further (downward) scaling of gate-source voltages, and thus may hinder or prevent decreasing the power requirements of a chip in which MOSFET transistors are included.

The above issue is further exacerbated by the fact that power consumption of MOSFET devices has been observed to increase as such devices are scaled down. The increased power consumption is believed to result at least in part from increased source to drain leakage currents, which in turn may be the result of small channel length dimensions that are employed such devices (i.e., short channel effects). This increase in leakage current may translate to a meaningful increase in off-current ($I_{off}$), particularly when large numbers of MOS devices will be used in an integrated circuit device, such as a processor or other chip.

Tunneling field effect transistors (TFETs) have been proposed as a successor to MOSFETs. Among other things TFETs operate using a different physical mechanism enabling relatively low off current. Moreover, the theoretical sub-threshold swing limit of a TFET can be less than 60 mV/decade. TFETs therefore offer the potential of operating at lower gate-source voltages $V_{gs}$, relative to useful gate-source voltages for MOSFETs.

Despite those potential advantages, many TFETs suffer from relatively low "on current" $I_{on}$ at a given gate-source voltage and/or "off current" $I_{off}$. This may stem, for example, from the relatively high resistance of the tunnel barrier. Although heterojunction TFETs have shown some promise in that some have been shown to exhibit a combination of relatively high $I_{on}$ and relatively low $I_{off}$, experimental verification of these devices has yet to show sub-60 mV/dec sub-threshold swing.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Figure 1:
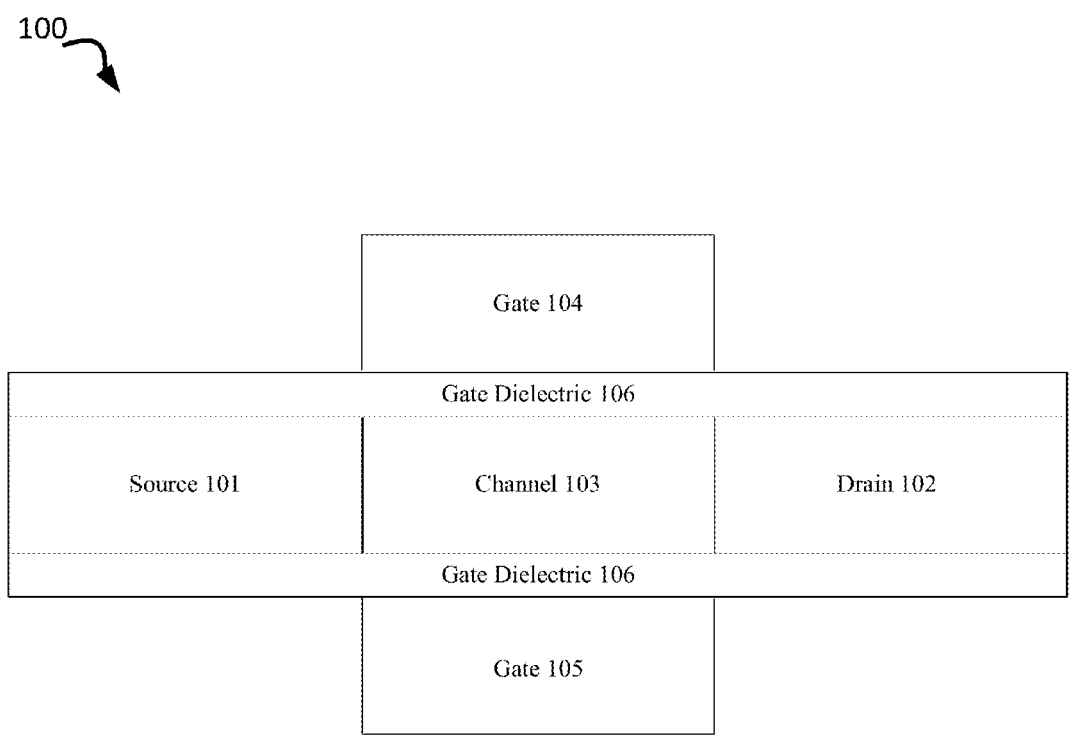
FIG. 1 is a block diagram of an example tunneling field effect transistor (TFET) consistent with the present disclosure.

Although the following Detailed Description will proceed with reference being made to illustrative embodiments, many alternatives, modifications, and variations thereof will be apparent to those skilled in the art.

DETAILED DESCRIPTION

For simplicity and clarity, the FIGs. of the present disclosure illustrate the general manner of construction of various embodiments, and descriptions and details of well-known features and techniques may be omitted to avoid unnecessarily obscuring the discussion of described embodiments of the present disclosure. It should be understood that the elements of the FIGs. are not necessarily drawn to scale, and that the dimensions of some elements may be exaggerated relative to other elements for the purpose of enhancing understanding of described embodiments.

The terms, "first," "second," "third," and the like are used in the present disclosure and the claims to distinguish between similar elements, and not necessarily for describing a particular sequential or chronological order. It should be understood that such terms may be interchangeably used in appropriate circumstances, such that the aspects of the present disclosure may be operable in an order other than which is explicitly described.

As explained briefly in the background, tunneling field effect transistors (TFETs) have the potential to exhibit various benefits over metal oxide semiconductor devices such as MOSFETS. To date however many TFETs exhibit relatively low on currents $I_{on}$ at a given gate-source voltage and/or off current $I_{off}$, which can limit their practical usefulness. Moreover, many experimental studies of TFETs indicate that the studied TFETS exhibited a sub-threshold swing higher than the 60 mV/decade limit exhibited by MOSFETs. TFETs with improved performance characteristics are therefore of interest.

With the foregoing in mind, the present disclosure generally relates to TFETs that include a channel with bandgap characteristics that may be altered by at least one of the application or removal of a force. For clarity, such channels are hereinafter referred to as a "variable bandgap channel." As will be described in detail later, use of a variable bandgap channel may allow for the dynamic adjustment of the bandgap of the channel, thereby providing fine control over the operation of the TFET. Furthermore use of a variable bandgap channel may enable the production of TFETs that exhibit desirable performance characteristics, particularly as compared to a TFET employing a channel formed of an undoped semiconductor material, such as but not limited to InAs, IngaAs, Ge, GeSn, combinations thereof, and the like (hereinafter referred to for convenience as a "conventional TFET").

More particularly and as will become apparent from the following discussion, in some embodiments TFETs consistent with the present disclosure may exhibit ON currents $I_{on}$ that are relatively high and OFF currents $I_{off}$ that are relatively low, particularly when compared to the $I_{on}$ and $I_{off}$ exhibited by a conventional TFET. Furthermore in some embodiments, TFETs consistent with the present disclosure may exhibit a sub-threshold swing (SS) at room temperature that is less than the SS of a conventional TFET, and in some cases lower than the 60 mV/decade limit exhibited by MOS devices such as MOSFETs.

With the foregoing in mind, one aspect of the present disclosure relates to TFETs that include a variable bandgap channel. Reference is therefore made to FIG. 1, which is a cross-sectional block diagram of one example of a TFET consistent with the present disclosure. As shown, TFET 100 includes source 101, drain 102, channel 103, first gate 104, second gate 105, and gate oxide 106. In the illustrated embodiment, channel 103 is between source 101 and drain 102. Moreover, channel 103 is between first gate 104 and second gate 105, such that first gate 104 is proximate a first side (not labeled) of channel 103, and second gate 105 is proximate a second side (not labeled) of channel 103. Furthermore in the illustrated embodiment, the first and second sides of channel 103 are substantially opposite one another. In any case, all or a portion of each of source 101, gate 102, channel 103, second gate 105, and gate dielectric 106 may be formed on a substrate (not shown).

For the sake of illustration, FIG. 1 and various other FIGS. depict TFETs consistent with the present disclosure, wherein the various components thereof are laterally laid out relative to one another. Accordingly, such FIGS. may be understood to illustrate planar TFETs. It should be understood that such illustrations are for the sake of example only, and that TFETs having other configurations may be utilized and are envisioned by the present disclosure. By way of example, the present disclosure specifically envisions embodiments wherein one or more of the components of the TFETs illustrated in FIG. 1 and other FIGS. are stacked upon one another, such that a vertical relationship between the various components is established.

Source 101 is operable to inject carriers into the channel of a field effect transistor (FET), as generally understood in the art. Similarly, drain 102 is operable to remove carriers from a channel of a FET, as generally understood in the art. In the embodiment of FIG. 1, source 101 functions to inject carriers into channel 103, and drain 102 functions to remove carriers from channel 103. Source 101 and drain 102 may be respectively coupled to one or more source and drain contacts (not shown).

Source 101 and drain 102 may each be formed from any suitable n or p type semiconductor material. Non-limiting examples of such materials include n doped or p doped gallium antimonide (GaSb), gallium arsenide (GaAs), gallium arsenide antimonide (GaAsSb), germanium (Ge), indium arsenide (InAs), indium antimonide, indium gallium arsenide (InGaAs), InGaAsSB, silicon (Si), SiGe, SiGeSn combinations thereof, and the like. Without limitation, an n type semiconductor (e.g. n-doped silicon) is preferably used to form one of source 101 and drain 102, and a p type semiconductor (e.g., p-doped silicon) is preferably used to form the other of source 101 and drain 102. In some embodiments, source 101 includes or is formed from an n-type semiconductor and drain 102 includes or is formed from a p-type semiconductor. In other embodiments, source 101 includes or is formed from a p-type semiconductor and drain 102 includes or is formed from an n-type semiconductor. For the sake of illustration, various FIGs. of the present disclosure illustrate embodiments wherein source 101 is a p type semiconductor and drain 102 is an n-type semiconductor.

Channel 103 generally form a source-channel interface between source 101 and drain 102, and is operable to prevent or allow carriers to flow from source 101 to drain 102. As will be described in detail below, channel 103 is configured as a variable bandgap channel, i.e., such that its bandgap characteristics may be dynamically altered by the application and/or removal of a force. For example, the tunnel barrier height of channel 103 may change in response to at least one of an application or removal of a force, potentially altering the operational state of the TFET.

First gate 104, second gate 105 generally perform device specific functions that are understood in the art, and for the sake of brevity such functions will not be described herein in detail. Alternatively or in addition to such functions, in some embodiments first gate 104 and second gate 105 may be utilized to apply (or cease to apply) one or more forces to channel 103, so as to alter or change the bandgap characteristics of channel 103 in a desired manner. By way of example, one or both of first gate 104 and second gate 105 may be utilized to apply a voltage and/or electric field to/from channel 103. Application of the voltage and/or electric field may cause bandgap characteristics (e.g., tunnel barrier height) of channel 103 to change, potentially changing the operational state of TFET 100 from OFF to ON, and vice versa.

In this regard, first and second gates 104, 105 may be formed from any suitably conductive material, such as but not limited to polysilicon, polygermanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, and fully germanided metals (FUGE). The materials used to form first and second gates 104, 105 may be chosen such that a particular gate work function is obtained.

Gate dielectric 106 generally functions to insulate source, channel 103, drain 102, and first and second gates 104, 105 from one another. Gate dielectric 106 may therefore be formed from any suitable electrically insulating material. Non-limiting examples of suitable materials that may be used to form gate dielectric 106 include silicon oxide and high k dielectrics (e.g., dielectric materials with a dielectric constant greater than 7) such as hafnium oxide, tantalum pentaoxide, titanium oxide, zirconium oxide, combinations thereof, and the like. Of course, other insulating materials may also be used to form gate dielectric 106.

As noted previously, channel 103 is generally configured such that its bandgap characteristics may be changed and/or selected by the application and/or removal of a force such as a voltage, electric field, combination thereof and the like. In this regard, channel 103 may be configured to exhibit a relatively large bandgap in a first (e.g., insulating) state and a relatively small bandgap in a second (e.g., conducting) state, wherein the first and second states may be selected and/or influenced by the application and/or withdrawal of a force such as an applied electric field, voltage, combination thereof, and the like.

Alternatively or additionally, channel 103 may be configured so as to exhibit a relatively large tunnel barrier height in the first state, and a relatively small tunnel barrier height in the second state. As may be appreciated, higher tunneling probability through channel 103 may be expected when it is in the second state and exhibits the second (relatively small) tunnel barrier height, relative to when it is in the first state and exhibits the first (relatively high) tunnel barrier height.

While the present disclosure focuses on embodiments wherein channel 103 may exhibit distinct first and second states with distinct bandgap properties, it should be understood that such description is for the sake of clarity and ease of understanding only, and that channel 103 need not exhibit a stark transition between the first and second states. Indeed in some embodiments channel 103 may be configured such that a plurality and/or gradient of states exist or can exist between the first and second states described above. In such instances, control over and/or selection of the relative state (and, consequently, bandgap characteristics of channel 103) may be achieved through appropriate control of the force applied to and/or removed from channel 103, e.g., by source 101, drain 102, first gate 104, second gate 105, and combinations thereof.

With the foregoing in mind, one aspect of the present disclosure relates to TFETs that include a variable bandgap channel formed by a stack including at least first material layer having first bandgap characteristics and a second material layer having second bandgap characteristics. In such embodiments, the first material layer may be formed on the second material layer, or vice versa. Regardless and without limitation, the first material layer is preferably formed from an insulator with a first bandgap, and the second material layer is preferably formed from a conductive material having a second bandgap, wherein the first bandgap is larger than the second bandgap.

As will be described later, the bandgap characteristics of the variable bandgap channel as a whole may be impacted by the relative distribution/amount of the first and second material layers relative to one another, which may be dynamically changed by the application and/or removal of a force such as a voltage. Experiments have demonstrated that application and/or removal of a force such as an electric field by means of a voltage may alter a relative distribution of ions/vacancies within the first and second layers, e.g., by causing the ions/vacancies to drift from the first material layer to the second material layer or vice versa. In this way, application and/or removal of a force to/from the variable bandgap channel may affect the overall distribution and/or relative amount of ions/vacancies within the first and second materials layers and, consequently, the bandgap characteristics of channel 103 as a whole.

Figure 2A:
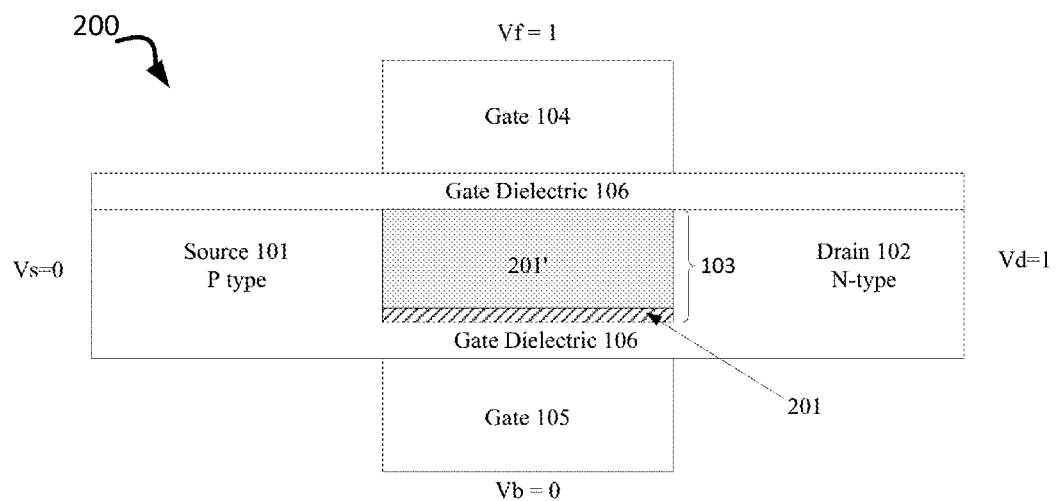
FIG. 2A illustrates an example TFET consistent with the present disclosure, wherein the TFET is switched ON and includes a variable bandgap channel that is switched ON and OFF by the drift of ions/carriers.
Figure 2B:
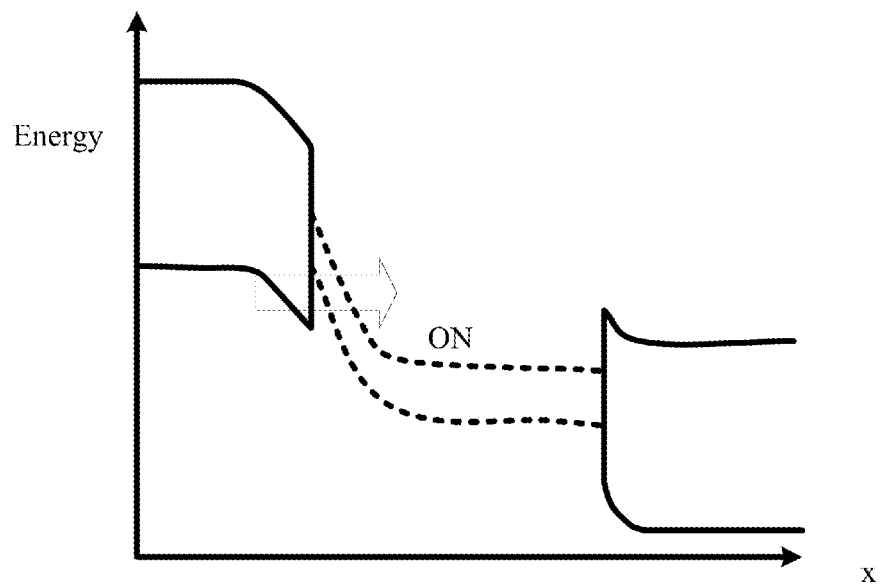
FIG. 2B is a bandgap diagram of the TFET of FIG. 2A
Figure 2C:
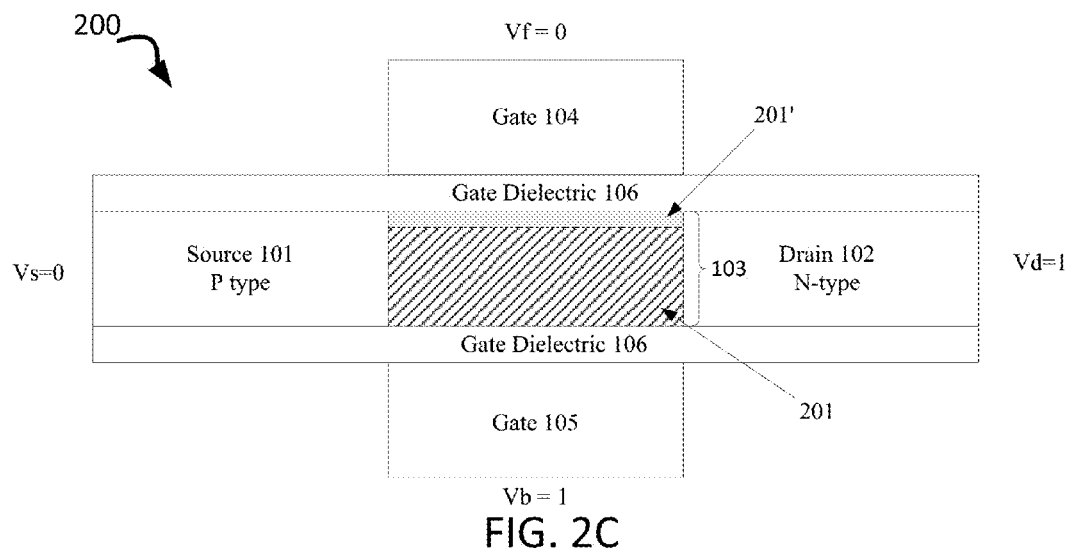
FIG. 2C illustrates an example TFET consistent with the present disclosure, wherein the TFET is switched OFF and includes a variable bandgap channel that is switched ON and OFF by the drift of ions/carriers.

Reference is therefore made to FIGS. 2A and 2C, which are block diagrams of an example TFET consistent with the present disclosure, and which includes a variable channel that is formed from first and second material layers as generally described above. As shown, TFET 200 includes p type source 101, n type drain 102, first and second gates 104, 105, and gate dielectric 106, the function and nature of which have been previously described. In addition, TFET 200 includes channel 103, which in this case is formed by first material layer 201 and second material layer 201'. Consistent with the foregoing description, first material layer 201 in this embodiment is formed from an insulating material exhibiting a relatively large bandgap, and second material layer 201' is formed from an insulating material exhibiting a relatively small bandgap. As discussed previously, the relative distribution of ions/vacancies within the first and second material layers 201, 201' may be adjusted by the application of a force and/or removal of an applied force, such as voltage applied via gate 104 or gate 105.

Non-limiting examples of suitable materials that may be used to form first and second material layers 201, 201' include materials that respond to an applied force in such a way as to alter the bandgap characteristics of the stack of first and second materials layers 201, 201' as a whole. In this regard, suitable materials that may be used to form first material layer 201 include but are not limited to inorganic oxides and nitrides that are electrically insulating and exhibit a relatively large bandgap. Non-limiting examples of such oxides include aluminum oxide ($Al_2O_3$), barium titanate ($BaTiO_3$), barium zirconate ($BaZrO_3$), hafnium dioxide ($HfO_2$), silicon dioxide ($SiO_2$), silicon nitride ($Si_3N_4$), niobium pentoxide ($Nb_2O_5$), tantalum pentoxide ($Ta_2O_5$), titanium dioxide ($TiO_2$), vanadium oxide ($VO_2$), yttrium oxide ($Y_2O_3$), zirconium dioxide ($ZrO_2$), and zirconium silicate ($ZrSiO_4$). Without limitation, first material layer 201 is preferably formed from $TiO_2$, $Nb_2O_5$, $Ta_2O_5$ and $VO_2$. In some embodiments, first material layer 201 is formed from $TiO_2$.

As may be appreciated, the aforementioned oxides and nitrides may exhibit type I band alignment at the heterojunction between source 101 and drain 102, particularly when source 101 and drain 102 are formed from silicon. Of course, the above identified materials are listed as examples only, and other materials may be used to form first material layer 201.

Examples of suitable materials that may be used to form second material layer 201' include but are not limited to partially oxidized inorganic oxides and partially nitrided inorganic nitrides that are conductive and which exhibit a relatively small bandgap and/or a relatively small tunnel barrier height, as compared to the corresponding bandgap characteristics of the first material layer 201. Non-limiting examples of such materials include $Al_2O_x$ (where x is less than 3), $BaTiO_x$ (where x is less than 3), $BaZrO_x$ (where x is less than 3), $HfO_x$ (where x is less than 2), $SiO_x$ (where x is less than 2), $Si_3N_x$ (where x is less than 4), $Nb_2O_x$ (where x is less than 5), $Ta_2O_x$ (where x is less than 5), $TiO_x$ (where x is less than 2), $VO_x$ (where x is less than 2), $Y_2O_x$ (where x is less than 3), $ZrO_x$ (where x is less than 2), and $ZrSiO_x$ (where x is less than 4). Without limitation, second material layer 201' is preferably partially oxidized titanium dioxide ($TiO_x$, where x is less than 2), partially oxidized niobium pentoxide ($Nb_2O_x$, where x is less than 5), partially oxidized tantalum pentoxide ($Ta_2O_x$, where x is less than 5), and partially oxidized vanadium dioxide ($VaO_x$, where x is less than 2). In some embodiments, second material layer 201' is formed of partially oxidized titanium dioxide ($TiO_x$, where x is less than 2)

Put in other terms, second material layer 201' may be partial oxide or nitride that is complementary to the inorganic oxides and/or nitrides of the first material layer. In this context, the partial oxides may be understood to contain or be doped with one or more positively charged oxygen vacancies, and the partial nitrides may be understood to contain or be doped with one or more positively charged nitrogen vacancies. Without limitation, second material layer 201' is preferably a partially oxidized inorganic oxide of titanium, tantalum, niobium, or vanadium, which is complementary to a corresponding oxide used to form first material layer 201 and which contains or is doped with one or more positively charged oxygen vacancies.

As mentioned briefly above, control over the bandgap characteristics of channel 103 may be achieved through the controlled application and/or removal of a force to/from one or more of first material layer 201 and second material layer 201'. For example and as shown in FIG. 2A, application of a voltage of logic 0 to second gate 105 ($V_b$=0) and a voltage of logic 1 (e.g., 0.5V) to first gate 104 ($V_f$=1) may increase the relative amount and/or alter the distribution of ions/vacancies among first and second material layers 201 and 201'. Similar to the above, experiments have demonstrated that application of a voltage in this manner may cause ions/vacancies (e.g., oxygen or nitrogen ions/vacancies) to migrate/drift from second material layer 201' to first material layer 201. Depending on the relative distribution of such ions/vacancies, TFET 200 may be placed in an ON or OFF state. In the ON state, a relatively large numbers of electrons may tunnel from source 101 through channel 103 when a drain voltage (Vd) of logic 1 and source voltage $V_s$ of 0 are applied. In this way, first and second material layers 201, 201' may in some embodiments be understood to respond to an applied voltage in much the same way as a memristor.

This concept is qualitatively illustrated in FIG. 2B, which is a band diagram of TFET 200 in the ON state shown in FIG. 2A. As shown, when a $V_f$ of logic 1 (e.g., about 0.5V) and a $V_b$ of logic 0 are applied, ions/vacancies may drift from second material layer 201' to first material layer 201, reducing the bandgap and/or tunnel barrier height of channel 103. As shown by transparent arrow in FIG. 2B, when a drain voltage $V_d$ of logic 1 and $V_s$ of logic 0 are applied relatively large numbers of electrons may tunnel from source 101 through the relatively low tunnel barrier of channel 103.

Conversely and as shown in FIG. 2C, reversing the polarity of the voltage applied across first and second gates 104, 105 may cause ions/vacancies to drift from first material layer 201 into second material layer 201', thereby changing the position of the boundary between layer 201 and layer 201', and potentially rendering channel 103 insulating. Application of a voltage in the above manner may cause ions/vacancies (e.g., oxygen and/or nitrogen vacancies) to drift from first material layer 201 to second material layer 201'. This may place TFET 200 in an OFF state, even when $V_d$ of logic 1 and Vs of logic 0 are respectively applied to drain 102 and sources 101.

Figure 2D:
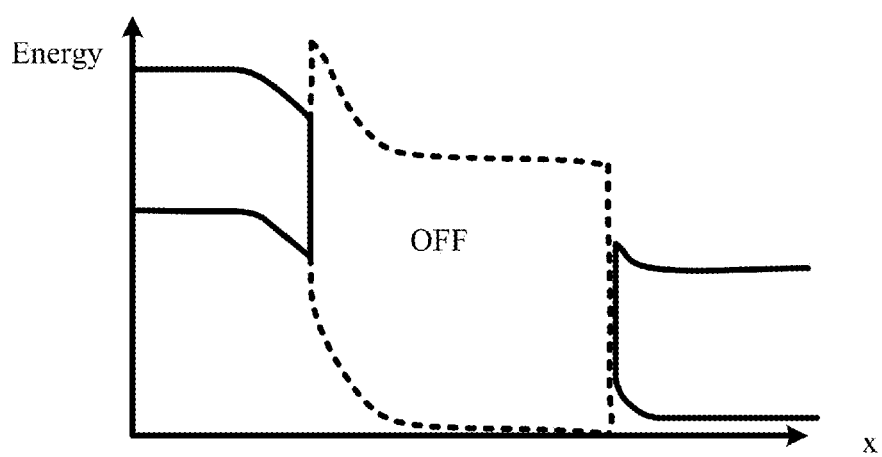
FIG. 2D is a bandgap diagram of the TFET of FIG. 2C.

This concept is further illustrated in FIG. 2D, which is a bandgap diagram of TFET 200 in the OFF state shown in FIG. 2C. As shown, when a $V_f$ of logic 0 and a $V_b$ of logic 1 (e.g., about 0.5V) are applied, ions/vacancies may drift from first material layer 201 to second material layer 201', thereby causing channel 103 to exhibit a relatively large bandgap and/or a relatively high tunnel barrier height which can hinder or prevent the tunneling of electrons from source 101 through channel 103. Indeed in the OFF state, tunneling through channel 103 may be reduced by one or several orders of magnitude, relatively to the same TFET in the ON state (e.g., as shown in FIGS. 2A and 2B). Tunneling of carriers from source 101 through channel through region 103 in this state may also be significantly reduced relative to a conventional TFET.

As may be appreciated from FIGS. 2B and 2D, the state of channel 103 may be selected and/or controlled through the application and/or removal of a force such as a voltage applied via first and/or second gates 104, 105. When application and/or removal of the force places channel 103 in the ON state, electrons from source 101 only need to tunnel through a relatively thin tunneling barrier as shown in FIG. 2B. As a result, large numbers of electrons may tunnel through source 103 in this state, thereby allowing TFET to exhibit an ON current $I_{on}$ that is relatively high as compared to a conventional TFET employing a channel formed of undoped semiconductor material. Conversely when application or removal of the force (e.g. the voltage) places channel 103 in the OFF state, channel 103 may exhibit a large bandgap and relatively high tunneling barrier height. As a result, few or no electrons from source 104 may tunnel through channel 103 in this state, thus allowing TFET 200 to exhibit an off current that is relatively low (and potentially zero), compared to a conventional TFET.

Figure 3:
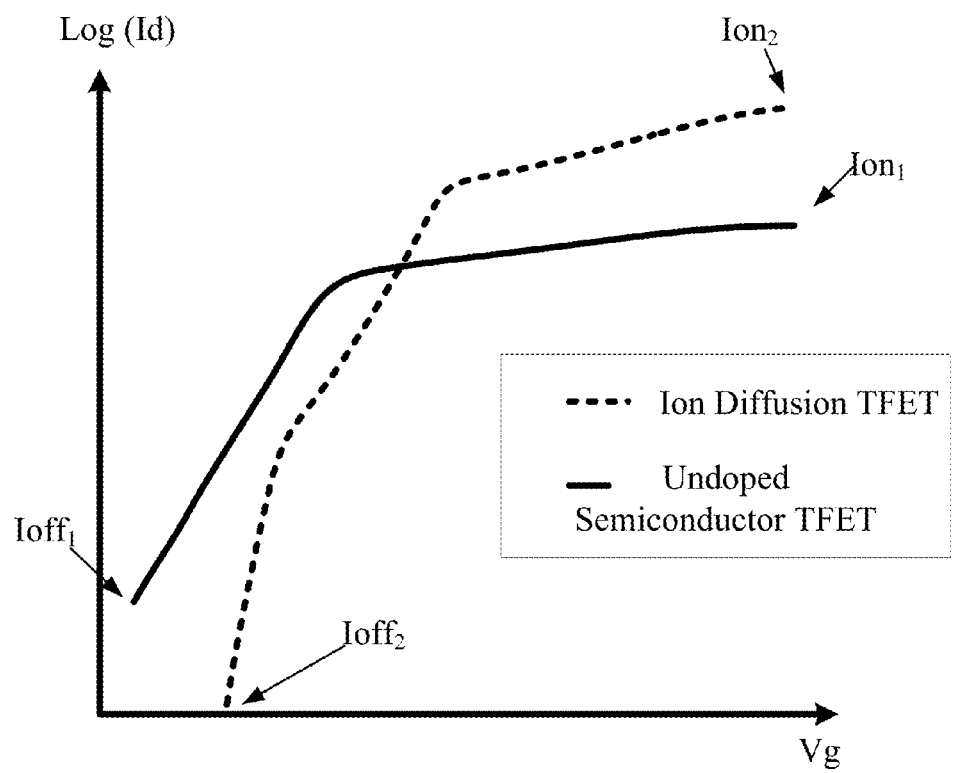
FIG. 3 is a graph qualitatively depicting a relationship of the logarithm of drain current (Id) versus applied gate voltage (Vg) for an example TFET including a channel switched by ion drift consistent with the present disclosure and a TFET including a channel formed of an undoped semiconductor material.

FIG. 3 is a graph predicting a relationship of the logarithm of drain current (Id) versus applied gate voltage (Vg) for an example TFET including a channel switched by ion drift consistent with the present disclosure and a conventional TFET including a channel formed of an undoped semiconductor material such as InAs. As shown, the TFET consistent with the present disclosure is expected to have an ON current ($Ion_2$) that is significantly greater than the on current of the conventional TFET, $Ion_1$ and an off current $Ioff_2$ that is significantly less than the off current ($Ioff_1$) exhibited by the conventional TFET, as shown in FIG. 3. In summary, the plot in FIG. 3 depicts that in some embodiments, TFETs consistent with the present disclosure may be able to exhibit a desirable combination of low off current and high on current.

As may be appreciated from the foregoing, the TFETs consistent with the present disclosure may be switched from an ON to and OFF state and vice versa by the application and/or removal of a force to/from channel 103, such as a voltage applied via first or second gates 104, 105. With this in mind, the rate at which the TFETs described herein may switch between the ON and OFF state may depend on the rate at which channel 103 may switch between states, which in turn may depend on various factors such as the total thickness of the first and second material layers, the relative mobility of ions/vacancies within the first and second material layers (i.e., the rate of ion/vacancy drift), other factors, combinations thereof, and the like.

With this in mind, the total thickness of the first and second material layers may range from greater than 0 to about 100 nm, such as about 1 to about 50 nm, or even about 5 to about 15 nm. In such instances, the channels described herein may switch between an ON and an OFF state in less than about 1500 picoseconds (ps), such as less than about 1000 ps, between about 100 to 1000 ps, between about 100 to about 500 ps, or even about 200 to about 400 ps. Although this may be slower than the switch time of a conventional TFET (which, for example may switch from an ON to OFF state and vice versa in about 50 ps), the relatively low off currents and relatively high on currents that may be exhibited by the TFETs described herein may make them particularly useful for low power or other applications. For example, the relatively slow switch time of the TFETs described herein may be leveraged to build circuits that include an "automatic sleep state". Indeed in some embodiments, the voltage at the gates of the TFETS described herein can be charged or discharged by an electric charge through wires faster than the ion/vacancy drift process occurs. If the voltage at the gates is not switched over a number of clock cycles corresponding to the time of ion/vacancy drift, transistor 200 may arrive at the low leakage current state depicted in FIGS. 2C and 2B.

The TFETs described herein may also be used to control the operation of downstream electronic components. For example, a TFET consistent with the present disclosure may be placed upstream of other circuit components, such as other transistors, diodes, memory registers, combinations thereof, and the like. In such instances, the operational status of circuit components downstream of the TFET may be switched ON and OFF by selecting the state of channel 103, i.e., by controlling a voltage or other force that may be applied to transition channel 103 from an insulating to a conducting state, or vice versa. In some embodiments once the state of channel 103 is set, the force applied to drive channel 103 to the desired state may be withdrawn without affecting the operation of the TFET or the downstream components. Because the state of channel 103 may be maintained in the absence of an applied force (e.g., in the absence of an applied voltage), the TFETs described herein can be used as an element of non-volatile computing circuits. In such integrated circuits, the state computational may be maintained even in the absence of power supplied to a part of such integrated circuit. In order to save on the power consumption of a computing system, a need may arise to turn off the power supply to this part of the integrated circuit. For non-volatile circuits, there is no need to back-up data within such circuits before such a turn-off, and no need to fetch the data from storage after the turn-off.

Another aspect of the present disclosure relates to TFETS that include a variable bandgap channel that is formed at least in part of a material that exhibits a metal to insulator (MIT) transition, i.e., a transition from a highly conductive to a highly resistive state. Of particular use in the present disclosure are materials that exhibit a MIT that is accompanied by a change in band structure. Non-limiting examples of materials that may exhibit an MIT that is accompanied by a change in band structure include Mott insulators. As used herein, the term "Mott insulator" refers to a subset of materials that exhibit an MIT and which are expected to be conductive under conventional band theory, but which may become resistive due to electron-electron correlations, e.g., in response to at least one of the application and withdrawal of a force such an electric field.

Non-limiting examples of suitable Mott insulators that may be used in accordance with the present disclosure include $VO_2$, chromium doped $V_2O_3$, $La_{2-x}Sr_xCuO_4$ (where x is less than or equal to 2), $RNiO_3$ (where R is one or more rare earth elements selected from lanthanum, cerium, praseodymium, neodymium, promethium, samarium, europium, gadolinium, terbium, dysprosium, holmium, erbium, thulium, ytterbium, lutetium, actinium, thorium, protactinium, uranium, plutonium, americium, berkelium, californium, einsteinium, fermium, mendelevium, nobelium, lawrencium, and combinations thereof), $La_{1-x}Sr_xMnO_3$ (where x is less than or equal to 1), and $YBa_2Cu_3O_7$. Without limitation, the Mott insulators preferably exhibit a metal insulator transition at above room temperature.

Figure 4:
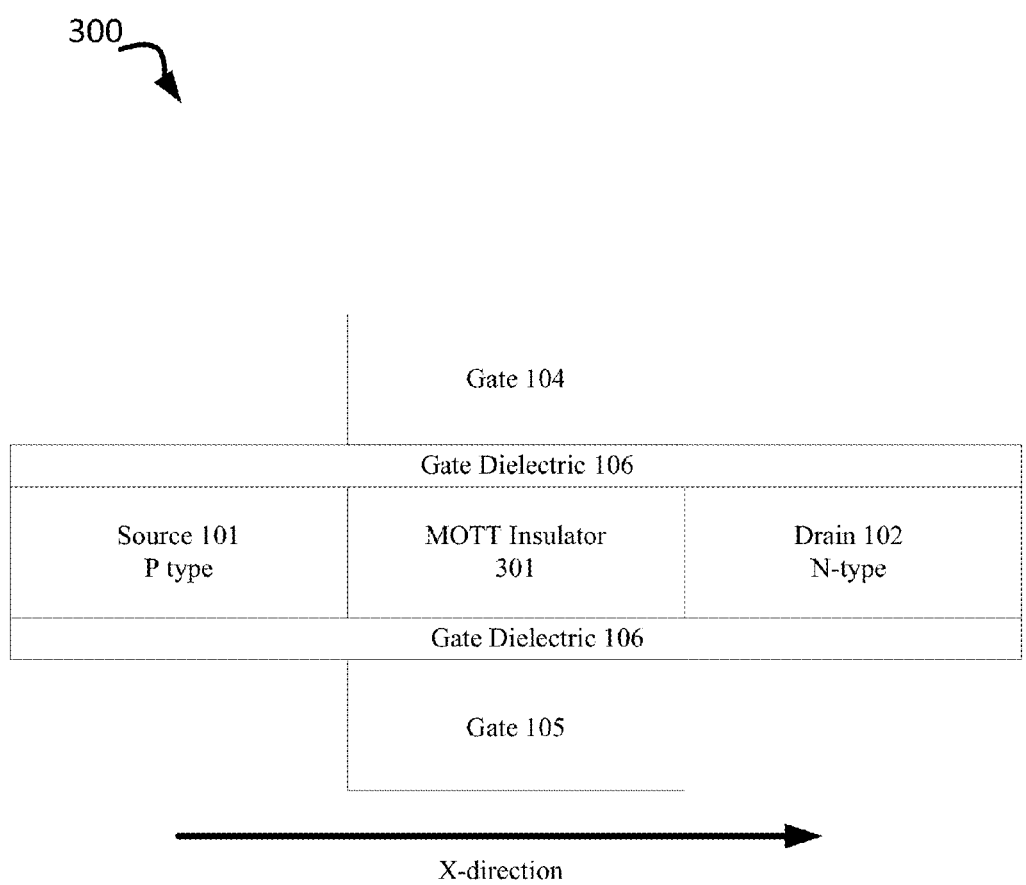
FIG. 4 is a block diagram of an example TFET consistent with the present disclosure, wherein the TFET includes a variable bandgap channel formed at least in part from a Mott insulator.

Reference is now made to FIG. 4, which is a cross sectional block diagram of another example of a TFET consistent with the present disclosure. As shown, TFET 300 includes source 101, drain 102, first gate 104, second gate 105, and gate oxide 106, the nature and function of which is the same as described above in connection with the corresponding parts of FIG. 1. In addition, TFET 300 includes a channel 301 that is formed at least in part of a Mott insulator.

In the illustrated embodiment, channel 301 is between source 101 and drain 102. Moreover, channel 301 is between first gate 104 and second gate 105, such that first gate 104 is proximate a first side (not labeled) of channel 301, and second gate 105 is proximate a second side (not labeled) of channel 103. In the illustrated embodiment, the first and second sides of channel 301 are substantially opposite one another. In any case, all or a portion of each of source 101, gate 102, channel 301, second gate 105, and gate dielectric 106 may be formed on a substrate (not shown). Of course, the structure of TFET 300 in FIG. 4 is for the sake of example only, and it should be understood that TFETs having other geometries/structure may be used.

In some embodiments the operation of TFET 300 may be predicated on the recognition that some Mott insulators (including those noted above) may exhibit a change in band structure in response to at least one of the application or removal of a force such as an electric field. In this regard, it is noted that the change in band structure may in some instances only occur when a Mott insulators is exposed to a critical electric field, i.e., an electric field having an intensity meeting or exceeding the minimum intensity needed to induce the change in band structure.

As noted previously, a conventional TFET may exhibit improved sub-threshold slope relative to a MOSFET. As will be described below, use of a variable bandgap channel in a TFET formed at least in part of a Mott insulator can further improve one or both of $I_{on}$ and the sub-threshold swing of a TFET. Indeed, in some embodiments, the use of a Mott insulator may enable the production of a TFET having higher $I_{on}$ than a conventional TFET that utilizes a channel formed from undoped semiconductor material and/or a MOSFET, while at the same time exhibiting a lower sub-threshold swing than the conventional TFET and/or MOSFET. For example, use of a Mott insulator to form a variable bandgap channel in a TFET may allow the TFET to achieve higher $I_{on}$ while simultaneously exhibiting a sub-threshold swing below the 60 mV/decade limit exhibited by MOSFETs. This can be forecasted with current understanding of bandgap effect on TFET current-voltage (I-V) characteristics.

Figure 5:
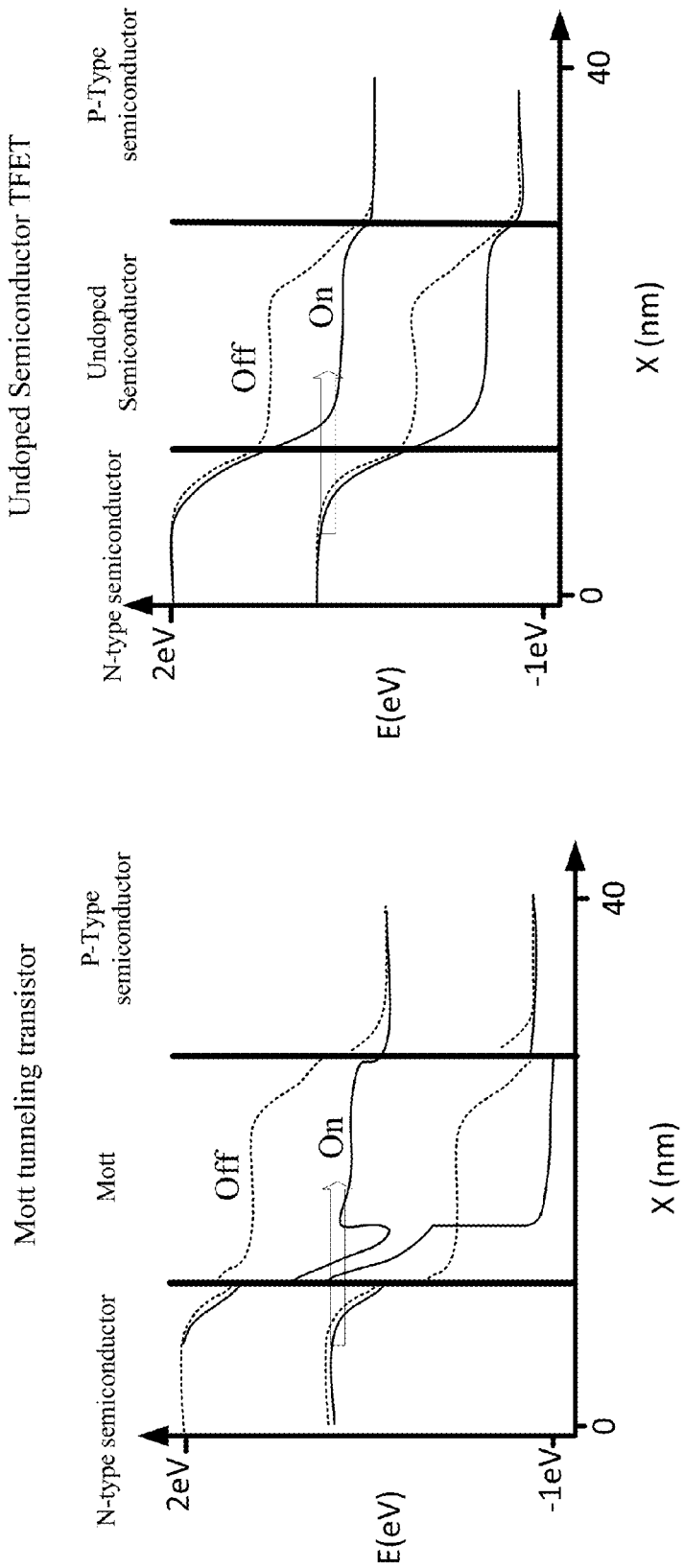
FIG. 5 depicts ON and OFF bandgap plots for an example TFET consistent with the present disclosure, wherein the TFET includes a variable bandgap channel formed at least in part with a Mott insulator, and ON and OFF bandgap plots of a TFET including a channel formed from undoped semiconductor material.

To illustrate the foregoing concept reference is made to FIG. 5, which depicts ON and OFF bandgap plots for an example TFET including a variable bandgap channel formed at least in part with a Mott insulator consistent with the present disclosure, and ON and OFF bandgap plots of a TFET including a channel formed from undoped semiconductor material. In this instance, the considered TFETs had an overall length in the x dimension of 40 nm, with a gate and channel length of about 14 nm.

As shown, when an electric field having an intensity below that of the critical electric field is applied to the variable bandgap channel (e.g., to the Mott insulator therein), the channel may remain in an OFF state, wherein the bandgap between the valence band and the conduction band in the channel is relatively large. However when an electric field meeting or exceeding the intensity of the critical electric field is applied to the variable bandgap channel, the bandgap between the valence and conduction bands may shrink in portions of the channel that are exposed to the highest intensity electric field. This in turn may cause a decrease in the bandgap between the conduction band of source 101 and the valence band of channel 301. As a result large numbers of electrons may tunnel from the conduction band of source 101 into the valence band of channel 301 when channel 301 is in the ON state.

Figure 6:
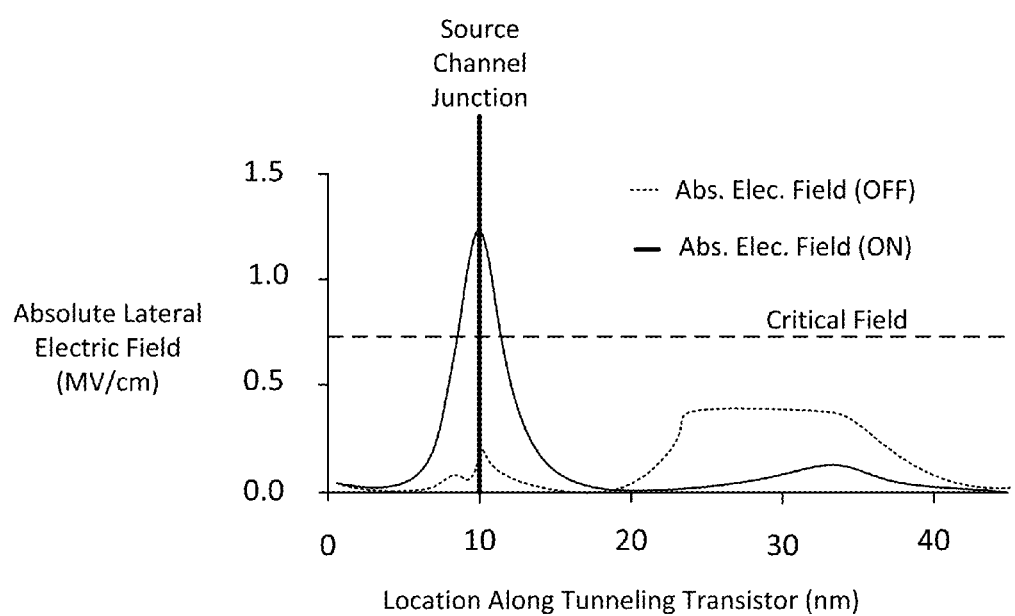
FIG. 6 is a plot of absolute lateral electric field vs. transistor location for an example TFET consistent with the present disclosure, wherein the TFET includes a variable bandgap channel formed at least in part of a Mott insulator.

For the sake of example and ease of understanding, the present disclosure will proceed to describe an example TFET that include a variable bandgap channel formed from a Mott insulator, wherein the total length of the TFET in the X axis is 40 nm and the channel and gate lengths are each about 14 nm. In this instance, the variable bandgap channel of the TFET may be turned ON by the application of an electric field proximate the junction of the source and channels. The magnitude of the electric filed may depend on the applied gate, drain and source voltages. Because the device body is thin and symmetric in this example, the perpendicular electric field is small in the example device and the total electric filed is dominated by the lateral electric field. As shown in FIG. 6, the intensity of the absolute lateral electric field may exceed the critical electric field (set for the sake of illustrate at ~0.7V in this example) at or near the junction of the source and channel.

Returning now to FIG. 5, it can be seen that when the Mott insulator forming channel 301 is exposed to an electric field exceeding the critical electric field (such as the one described in FIG. 6), at least a portion of the channel may turn ON and significant narrowing of the bandgap of the channel may be exhibited at or near the source/channel interface. Moreover, the gap between the conduction band of the source and the valence band of the channel may also narrow. As a result large numbers of electrons may tunnel through the channel to the drain in this state, as depicted by the transparent arrow in that plot.

In contrast, the plot in FIG. 5 for the conventional TFET indicates that even when its undoped semiconductor channel is in an ON state, the bandgap within the channel remains relatively large, and the gap between the conduction band of the source and the valence band of the channel also remains relatively large. Comparison of the plots of FIG. 5 suggests that a TFET employing a Mott insulator in its channel may permit greater tunneling than a conventional TFET at a given bias voltage.

Figure 7:
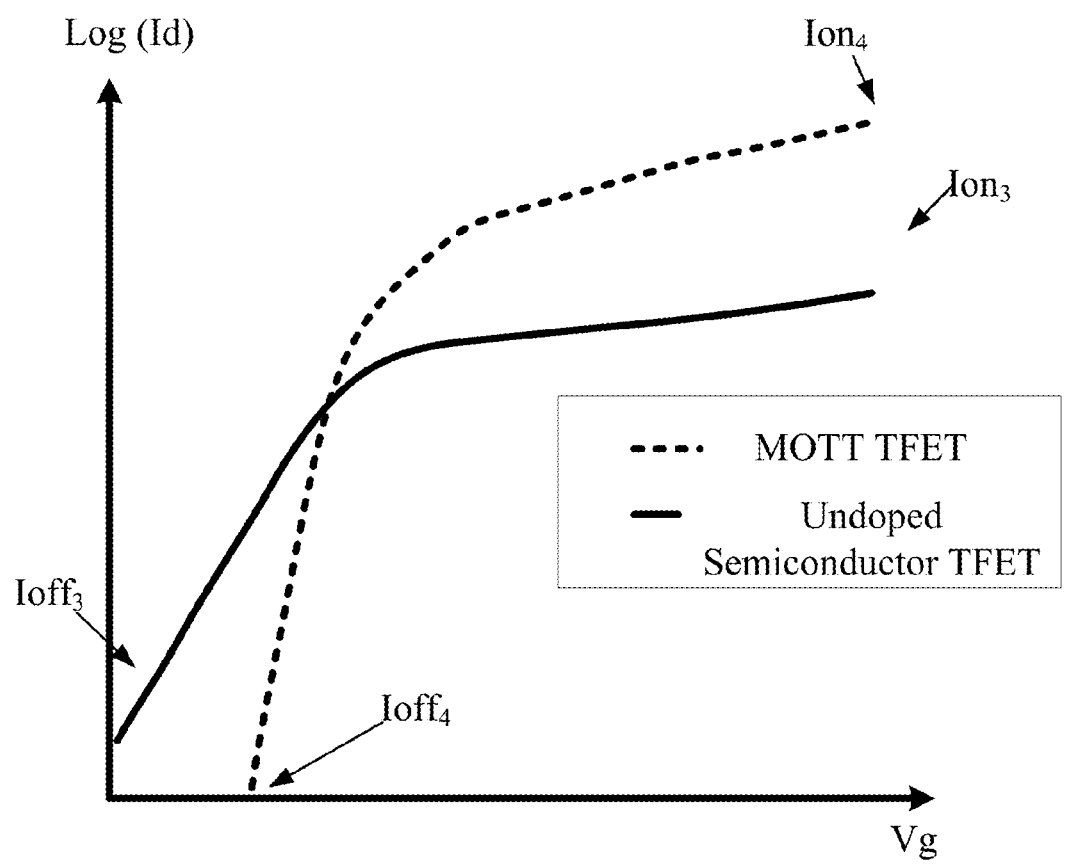
FIG. 7 is a graph qualitatively depicting a relationship of the logarithm of drain current (log(Id)) vs. applied gate voltage (Vg) for a TFET including a variable bandgap channel formed at least in part of a Mott insulator consistent with the present disclosure, and of a TFET including a channel formed from undoped semiconductor material.

This also suggests that a TFET employing a Mott insulator in its channel may exhibit on currents $I_{on}$ that are greater than the on current of a conventional TFET at a given driving voltage. In this regard, FIG. 7 is graph depicting a estimated relationship of the logarithm of drain current (Id) versus applied gate voltage (Vg) for an example TFET including a channel formed at least in part of a Mott insulator, and a conventional TFET including a channel formed of InAs. As shown, the TFET including a Mott insulator in the channel is expected to exhibit an ON current ($Ion_4$) that is greater than the on current of the conventional TFET, $Ion_3$. Indeed, the forecast suggests that $Ion_4$ may be 10 to 100 times greater (or more) than $Ion_2$. In addition, the TFET including the Mott insulator in its channel is expected to have an off current $Ioff_4$ that is less than the off current ($Ioff_3$) in the conventional TFET. In sum, the forecast plotted in FIG. 7 demonstrates that in some embodiments, TFETs including a Mott insulator in their channel may be able to exhibit desirable a combination of low off current and high on current, relative to a conventional TFET including a undoped semiconductor material in the channel.

Another aspect of the present disclosure relates to methods of forming TFETs consistent with the present disclosure. In this regard reference is made to FIG. 8, which is a flow diagram of example operations that may be performed in connection with a method of making a TFET consistent with the present disclosure. It should be understood that the method steps shown are illustrated in a particular order for the sake of clarity, but that in practice they may be performed in any order depending on the geometry and configuration of the TFET being formed.

Figure 8:
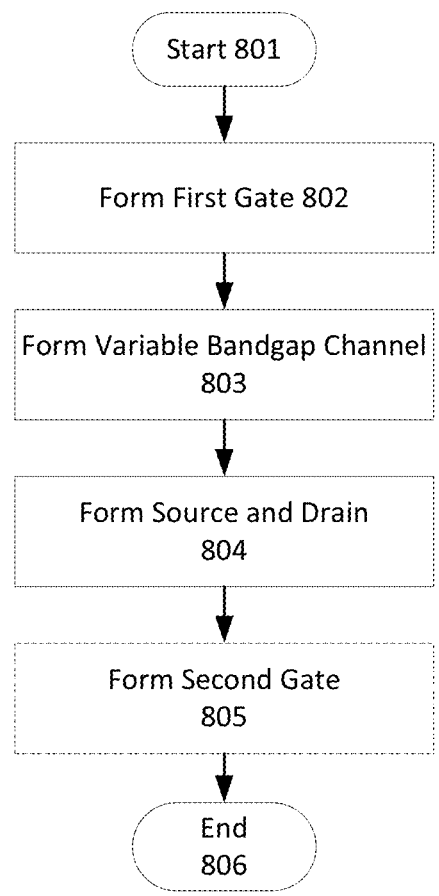
FIG. 8 is a flow diagram depicting example operations that may be performed in accordance with a method of producing a TFET consistent with the present disclosure.

As shown in FIG. 8, method 800 begins at block 801. At block 802, a first gate may be formed on a substrate, which may be made of silicon or another suitable material. The formation of the first gate may be performed using any suitable semiconductor manufacturing technique, including various forms of deposition (e.g., chemical vapor deposition, physical vapor deposition, sputtering, atomic layer deposition, electrodeposition, electroless deposition, etc.), as may be known in the art. In some embodiments and as shown in various FIGS, the first gate may be formed at a location proximate lower surface of a variable bandgap channel. In any case the first gate may be separated from the variable bandgap channel by a gate oxide, which may be deposited or otherwise formed over a surface of a first gate.

Prior to or subsequent the formation of the first gate, the method may proceed to block 803, wherein a variable bandgap channel may be formed. In instances where the variable bandgap channel is to be located above a gate, the variable bandgap channel may be formed on a first gate, such as the first gate formed pursuant to block 802. Regardless of when it is formed, the variable bandgap channel may be configured to exhibit a change in its bandgap characteristics in response to at least one of an application or withdrawal of an applied force, as generally described above. Accordingly, formation of the variable bandgap channel may involve depositing or otherwise forming first and second material layers that may collectively exhibit (e.g., via ion/carrier drift) a change in bandgap characteristics (e.g., tunnel barrier height) in response to an applied voltage, as generally described above. Alternatively or additionally, formation of the variable bandgap channel may involve the deposition or other formation of a Mott insulator. In any case, formation of the variable bandgap channel may be performed using any suitable semiconductor manufacturing process, including various deposition processes ((e.g., chemical vapor deposition, physical vapor deposition, sputtering, atomic layer deposition, electrodeposition, electroless deposition, etc.) as may be known in the art.

Prior to or subsequent the formation of the variable bandgap channel and/or first gate, the method may proceed to block 804, wherein a source and drain consistent with the foregoing description may be formed. In general, the source and drain may be formed at a location proximate the variable bandgap channel. In this regard, formation of the source and drain may proceed by depositing or growing suitable semiconductor materials (such as those described above) using any suitable semiconductor manufacturing process. Such materials may be intrinsic semiconductors, or may be doped during or after their initiation formation to become extrinsic p or n type semiconductors, as desired. Such doping may be performed using well known processes in the art, such as but not limited to diffusion and ion implantation. In some embodiments of the present disclosure, a source and drain are formed proximate to first and second sides, respectively, of a variable bandgap channel.

At this point the method may proceed to block 806 and end or, if a second gate is used, the method may proceed to optional block 805, wherein a second gate consistent with the present disclosure may be performed. The nature and manner of forming the second gate is the same as that of the first gate, and for the sake of brevity will not be reiterated. In some embodiments and as illustrated in various FIGS., the second gate may be formed on or proximate to an upper surface of a variable bandgap channel. Like the first gate, the second gate may be separated from the variable bandgap channel by gate oxide, which may have been previously deposited or otherwise formed on the variable bandgap channel.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A tunneling field effect transistor comprising:
    a source;
    a drain
    a variable bandgap channel between the source and the drain, wherein said variable bandgap channel comprises a first material layer and a second material layer, said first material layer comprising a first oxide selected from the group consisting of $Al_2O_3$, $HfO_2$, $SiO_2$, $Nb_2O_5$, $Ta_2O_5$, $TiO_2$, $VO_2$, $Y_2O_3$, and $ZrO_2$, and said second material layer comprising a second oxide that is partially oxidized and complimentary to said first oxide, the second material layer comprising at least one partial oxide selected from the group consisting of $Al_2O_x$, where x is less than 3, $HfO_x$, where x is less than 2, $SiO_x$, where x is less than 2, $Nb_2O_x$, where x is less than 5, $Ta_2O_x$, where x is less than 5, $TiO_x$, where x is less than 2, $VO_x$, where x is less than 2, $Y_2O_x$, where x is less than 3, and $ZrO_x$, where x is less than 2; and
    at least one gate region proximate the variable bandgap channel;
    wherein at least one bandgap characteristic of the variable bandgap channel dynamically changes in response to at least one of an application and removal of a force to the variable bandgap channel.

2. The tunneling field effect transistor of claim 1, wherein said force is chosen from a voltage, an electric field or a combination thereof.

3. The tunneling field effect transistor of claim 2, wherein said force is a voltage.

4. The tunneling field effect transistor of claim 2, wherein said force is an electric field.

5. The tunneling field effect transistor of claim 1, wherein said variable bandgap channel comprises a first material layer and a second material layer, the first and second material layers having a relative distribution of carriers therein, wherein said relative distribution of carriers changes in response to at least one of the application and removal of said force, resulting in a corresponding change to said at least one bandgap characteristic.

6. The tunneling field effect transistor of claim 1, wherein said first material layer comprises $TiO_2$ and said second material layer comprises $TiO_x$, where x is less than 2.

7. The tunneling field effect transistor of claim 1, wherein said variable bandgap channel comprises a material that exhibits a metal to insulator transition in response to at least one of the application and removal of said force.

8. The tunneling field effect transistor of claim 7, wherein said variable bandgap channel comprises a Mott insulator.

9. The tunneling field effect transistor of claim 8, wherein said Mott insulator comprises at least one of $VO_2$, chromium doped $V_2O_3$, $La_{2-x}(Sr_xCuO_4$, where x is less than or equal to 2, $RNiO_3$, where R is one or more rare earth elements, $La_{1-x}Sr_xMnO_3$, where x is less than or equal to 1, and $YBa_2Cu_3O_7$.

10. The tunneling field effect transistor of claim 1, wherein said tunneling field effect transistor exhibits a sub-threshold swing that is less than 60 mV/decade.

11. A method of manufacturing a tunneling field effect transistor comprising:
    forming at least one of a first gate and a second gate;
    forming a source;
    forming a drain; and
    forming a variable bandgap channel in a region proximate the first gate and second gate and between the source and drain, wherein said variable bandgap channel comprises a first material layer and a second material layer, said first material layer comprising a first oxide selected from the group consisting of $Al_2O_3$, $HfO_2$, $SiO_2$, $Nb_2O_5$, $Ta_2O_5$, $TiO_2$, $VO_2$, $Y_2O_3$, and $ZrO_2$, and said second material layer comprising a second oxide that is partially oxidized and complimentary to said first oxide, said second material layer comprising at least one partial oxide selected from the group consisting of $Al_2O_x$, where x is less than 3, $HfO_x$, where x is less than 2, $SiO_x$, where x is less than 2, $Nb_2O_x$, where x is less than 5, $Ta_2O_x$, where x is less than 5, $TiO_x$, where x is less than 2, $VON$, where x is less than 2, $Y_2O_x$, where x is less than 3, and $ZrO_x$, where x is less than 2;

wherein at least one bandgap characteristic of the variable bandgap channel dynamically changes in response to at least one of an application and removal of a force to the variable bandgap channel.

12. The method of claim 11, wherein said force is chosen from a voltage, an electric field or a combination thereof.

13. The method of claim 12, wherein said force is a voltage.

14. The method of claim 12, wherein said variable bandgap channel comprises a first material layer and a second material layer, the first and second material layers having a relative distribution of carriers therein, wherein said relative distribution of carriers changes in response to at least one of the application and removal of said force, resulting in a corresponding change to said at least one bandgap characteristic.

15. The method of claim 1, wherein said first material layer comprises $TiO_2$ and said second material layer comprises $TiO_x$, where x is less than 2.

16. The method of claim 11, wherein said variable bandgap channel comprises a material that exhibits a metal to insulator transition in response to at least one of the application and removal of said force.

17. The method of claim 15, wherein said variable bandgap channel comprises a Mott insulator.

18. The method of claim 16, wherein said Mott insulator comprises at least one of $VO_2$, chromium doped $V_2O_3$, $La_{2-x}Sr_xCuO_4$, where x is less than or equal to 2, $RNiO_3$, where R is one or more rare earth elements, $La_{1-x}Sr_xMnO_3$, where x is less than or equal to 1, and $YBa_2Cu_3O_7$.

19. The method of claim 11, wherein said tunneling field effect transistor exhibits a sub-threshold swing that is less than 60 mV/decade.

* * * * *